(12) United States Patent
Ream et al.

(10) Patent No.: US 10,976,219 B2
(45) Date of Patent: *Apr. 13, 2021

(54) LASER BEAM PROFILING SYSTEM FOR USE IN LASER POWDER BED FUSION MANUFACTURING

(71) Applicant: Edison Welding Institute, Inc., Columbus, OH (US)

(72) Inventors: Stanley L. Ream, Columbus, OH (US); Craig T. Walters, Powell, OH (US); Paul Boulware, Columbus, OH (US); Jacob Hay, Circleville, OH (US)

(*) Notice: Subject to any disclaimer, the term of this patent is extended or adjusted under 35 U.S.C. 154(b) by 0 days.

This patent is subject to a terminal disclaimer.

(21) Appl. No.: 16/814,313

(22) Filed: Mar. 10, 2020

(65) Prior Publication Data
US 2020/0209107 A1  Jul. 2, 2020

Related U.S. Application Data

(63) Continuation of application No. 16/368,968, filed on Mar. 29, 2019, now Pat. No. 10,627,311.
(Continued)

(51) Int. Cl.
*G01N 21/00* (2006.01)
*G01M 11/00* (2006.01)
(Continued)

(52) U.S. Cl.
CPC .......... *G01M 11/33* (2013.01); *B22F 3/1055* (2013.01); *B29C 64/153* (2017.08); *B29C 64/273* (2017.08); *B22F 2003/1057* (2013.01)

(58) Field of Classification Search
CPC .... G01M 11/33; B29C 64/153; B29C 64/273; B29C 64/393; B22F 3/1055;
(Continued)

(56) References Cited

U.S. PATENT DOCUMENTS 5,133,987 A   7/1992  Spence et al.
5,267,013 A  11/1993  Spence
(Continued)

FOREIGN PATENT DOCUMENTS

WO   WO 2017/108762 A1   6/2017
WO   WO 2017/194238 A1  11/2017

OTHER PUBLICATIONS

International Search Report and Written Opinion dated Jun. 24, 2019 for Application No. PCT/US2019/024740, 17 pages.

*Primary Examiner* — Abdullahi Nur

(57) ABSTRACT

A testing apparatus for use with a laser powder bed fusion additive manufacturing device that includes a laser for generating a non-stationary laser beam and a build plane positioned at a predetermined location relative to the non-stationary laser beam. The portable testing apparatus includes a support having an upper surface adapted to receive and absorb laser light generated by the non-stationary laser beam; a plurality of pin-hole defining structures each positioned to receive the laser light generated by the non-stationary laser beam, and such that each pin-hole is elevated at a predetermined height above the upper surface of the support and parallel thereto; a fiber optic cable disposed within each pin-hole defining structure, wherein each fiber optic cable has a proximal end at which the laser light is received through the pin-hole and a distal end to which the laser light is delivered; and a photodetector located at the distal end of each fiber optic cable, wherein the photodetector converts the laser light delivered to the photodetector into electrical voltage output signals based on intensity of the laser light received through each pin-hole.

20 Claims, 11 Drawing Sheets

Related U.S. Application Data

(60) Provisional application No. 62/650,421, filed on Mar. 30, 2018.

(51) Int. Cl.
*B29C 64/153* (2017.01)
*B22F 3/105* (2006.01)
*B29C 64/273* (2017.01)

(58) Field of Classification Search
CPC ............. B22F 2003/1057; G01R 31/00; H01S 5/0021; B33Y 50/02; B33Y 30/00; B33Y 40/00
See application file for complete search history.

(56) References Cited

U.S. PATENT DOCUMENTS

| | | | |
|---|---|---|---|
| 6,646,728 B1 | 11/2003 | Tang et al. | |
| 10,627,311 B2 * | 4/2020 | Ream | B33Y 50/02 |
| 2014/0212317 A1 | 7/2014 | Garry | |

\* cited by examiner

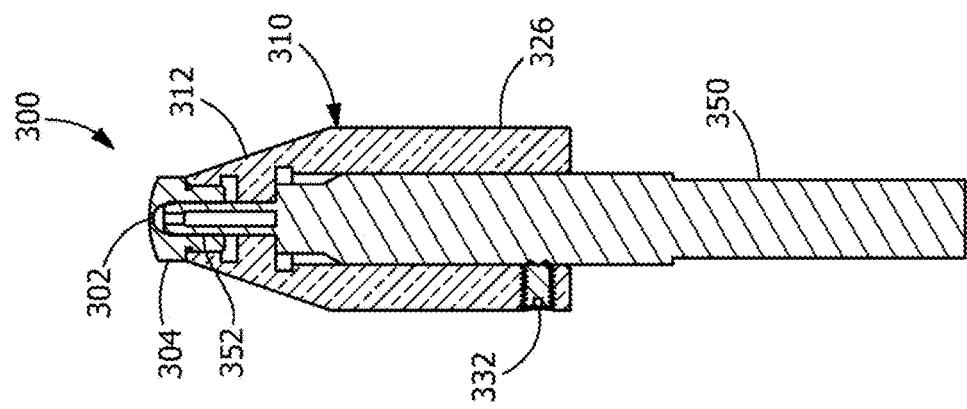
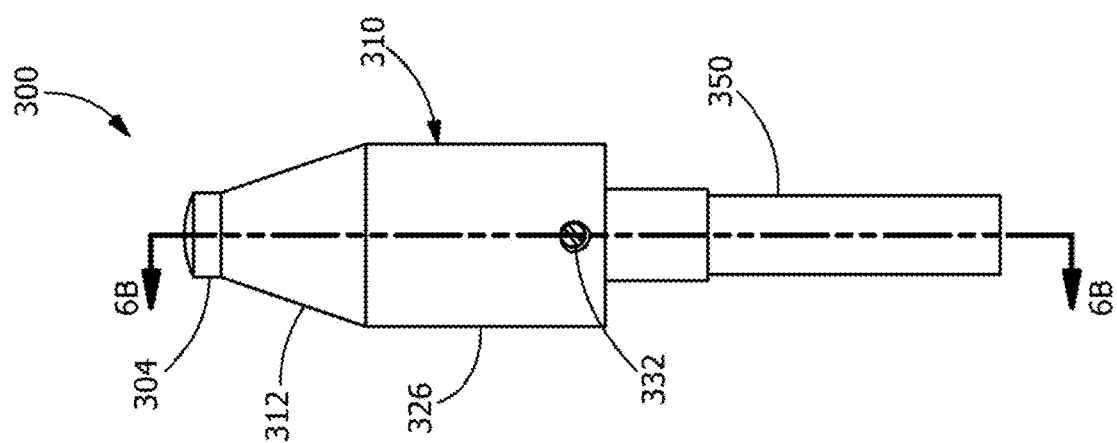

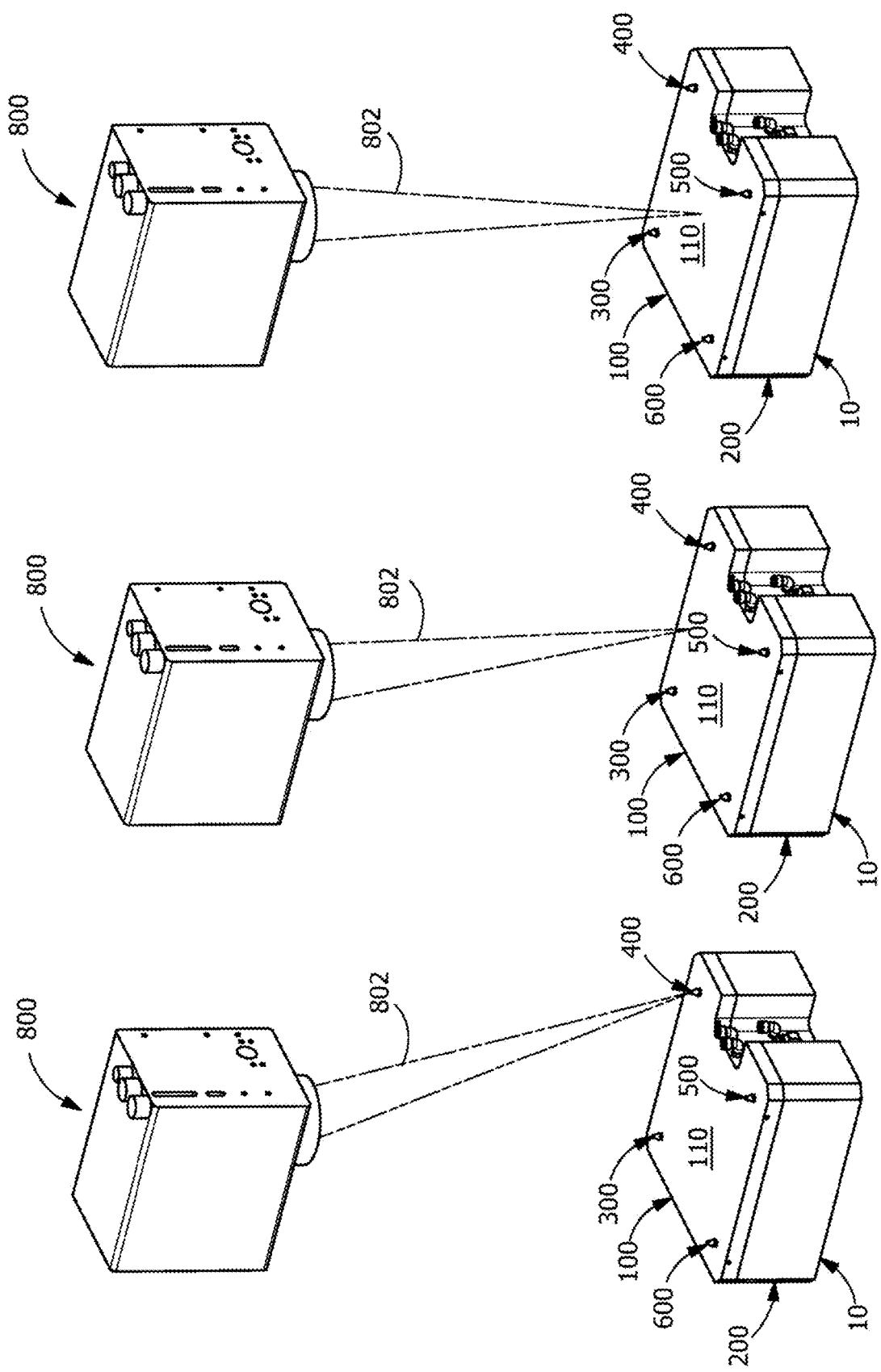

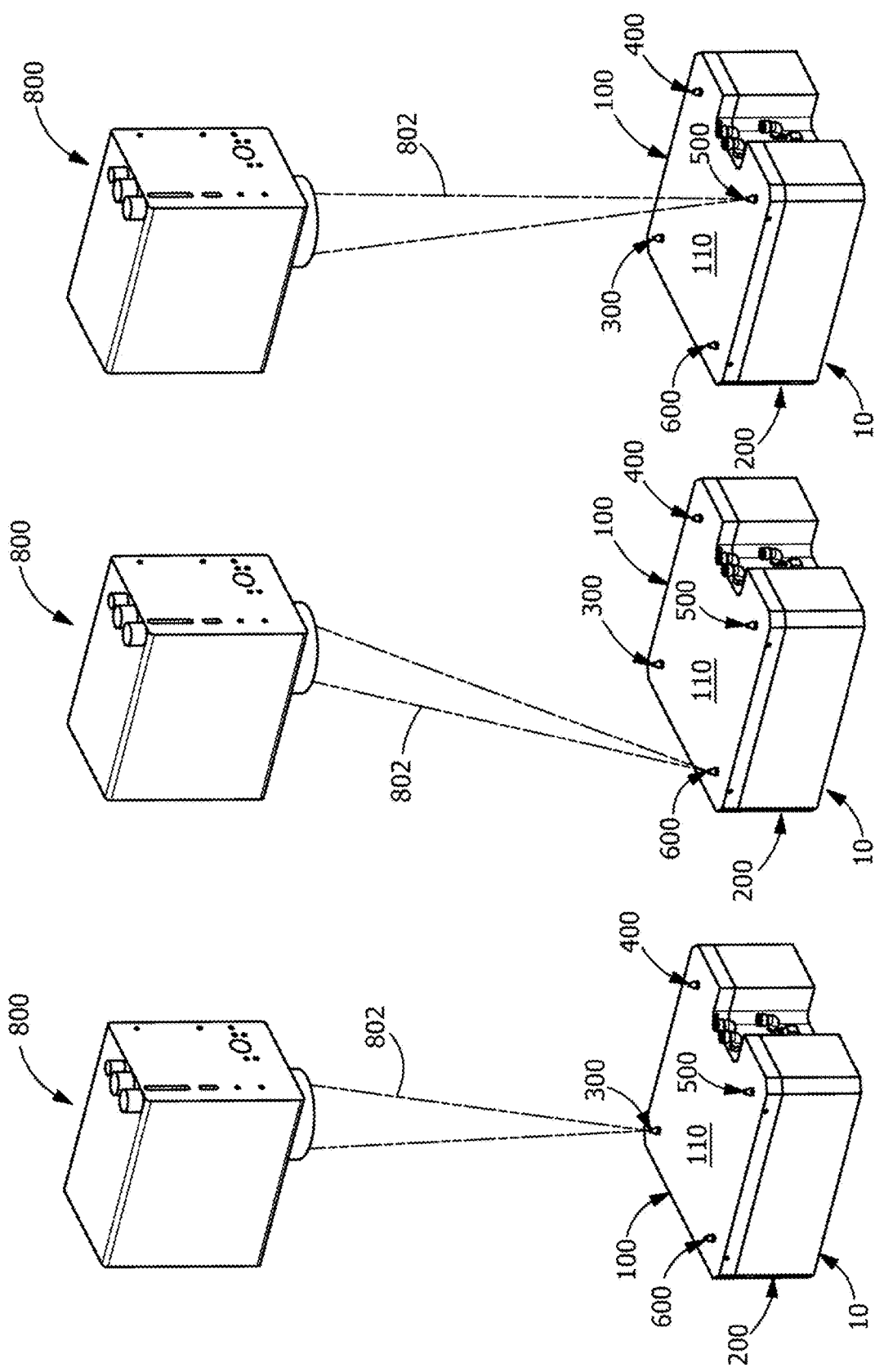

LASER BEAM PROFILING SYSTEM FOR USE IN LASER POWDER BED FUSION MANUFACTURING

CROSS-REFERENCE TO RELATED APPLICATIONS

This patent application is a continuation of U.S. patent application Ser. No. 16/368,968 filed on Mar. 29, 2019 and entitled "Laser Beam Profiling System for Use in Laser Powder Bed Fusion Manufacturing", which claimed the benefit of U.S. Provisional Patent Application No. 62/650,421 filed on Mar. 30, 2018 and entitled "Multi-Location Laser Beam Characterization System and Device for L-PBF", the disclosures of which are hereby incorporated by reference herein in their entirety and made part of the present U.S. utility patent application for all purposes.

BACKGROUND OF THE INVENTION

The described invention relates in general to additive manufacturing systems and processes, and more specifically to systems, devices, and methods for characterizing, analyzing, and verifying the proper functioning and performance of lasers used in laser powder bed fusion manufacturing processes.

Additive manufacturing is an industrial process that enables the creation of components and devices that are stronger and lighter than those made by more traditional processes such as machining and casting. Additive manufacturing utilizes data computer-aided-design (CAD) software or 3D object scanners for directing system hardware to deposit and bond or fuse material, layer upon layer, in precise geometric shapes or patterns. As implied by its name, additive manufacturing adds successive superfine layers of material to create a three-dimensional object. Each successive layer bonds or is fused to a preceding layer of melted or partially melted material and different substances for layering material, including metal powder, thermoplastics, ceramics, composites, glass, and other materials may be used. Three-dimensional objects that are to be created are first digitally defined by computer-aided-design (CAD) software that is used to create specific digital files that essentially "slice" the modeled object into ultra-thin layers. This information is then used to guide the path of a nozzle, print head, or other device as it precisely deposits material upon a preceding layer. Alternately, an electron beam or laser may be used to selectively melt or partially melt powdered material. As the material layers cool or are cured, these layers fuse together to form the desired three-dimensional object.

Powder Bed Fusion (PBF) technology is used in a variety of additive manufacturing processes, including direct metal laser sintering (DMLS), selective laser sintering (SLS), selective heat sintering (SHS), electron beam melting (EBM) and direct metal laser melting (DMLM). These systems use lasers, electron beams or thermal print heads to melt and fuse ultra-fine layers of material powder for creating a part or component. PBF processes typically involve the spreading of powdered material over previously deposited layers of material using a roller, recoater arm, or coating blade, or the like. A hopper or a reservoir positioned below or next to the powder bed is used to provide fresh powdered material. As the process concludes, excess powder is blasted away from the object. Laser Powder Bed Fusion (L-PBF) is another additive manufacturing process in which a three-dimensional component or part is built using a layer-by-layer approach by utilizing a high-power laser. L-PBF typically involves the following general steps: (i) a layer of powdered material (e.g., metal), typically about 0.04 mm thick, for example, is spread over a build platform or plate; (ii) a laser fuses the first layer or first cross-section of the part; (iii) a new layer of powder is spread across the previous layer using a roller or similar device; (iv) further layers or cross sections are fused and added; and (v) the process is repeated until the entire part is created. Loose, unfused powdered material remains in position, but is removed during post processing.

The implementation and use of L-PBF for additive manufacturing applications has increased tremendously in recent times. Large numbers of L-PBF systems have been sold and installed worldwide, and the rate of these sales is increasing. The functional success of L-PBF systems depends on the existence of a known and stable laser focal spot on the powder bed work plane. However, an instrument or device for accurately measuring the laser focal spot in a dynamic manner, throughout the extent of the work place, does not currently exist. Accordingly, there is an ongoing need for an accurate, easy to use, affordable instrument for analyzing the quality and dynamic accuracy of laser focal spots in various L-PBF systems and devices. This type of analysis could conceivably be made a requirement for the commissioning and routine certification of many, if not all, metal L-PBF systems and devices.

SUMMARY OF THE INVENTION

The following provides a summary of certain exemplary embodiments of the present invention. This summary is not an extensive overview and is not intended to identify key or critical aspects or elements of the present invention or to delineate its scope. However, it is to be understood that the use of indefinite articles in the language used to describe and claim the present invention is not intended in any way to limit the described system. Rather the use of "a" or "an" should be interpreted to mean "at least one" or "one or more".

In accordance with one aspect of the present invention, a first portable testing apparatus is provided. This testing apparatus is for use with a laser powder bed fusion additive manufacturing device that includes a laser for generating a non-stationary laser beam and a build plane positioned at a predetermined location relative to the non-stationary laser beam. The portable testing apparatus includes a support having an upper surface adapted to receive and absorb laser light generated by the non-stationary laser beam; a plurality of pin-hole defining structures each positioned to receive the laser light generated by the non-stationary laser beam, and such that each pin-hole is elevated at a predetermined height above the upper surface of the support and parallel thereto; a fiber optic cable disposed within each pin-hole defining structure, wherein each fiber optic cable has a proximal end at which the laser light is received through the pin-hole and a distal end to which the laser light is delivered; and a photodetector located at the distal end of each fiber optic cable, wherein the photodetector converts the laser light delivered to the photodetector into electrical voltage output signals based on intensity of the laser light received through each pin-hole.

In accordance with another aspect of the present invention, a second portable testing apparatus is provided. This testing apparatus is for use with a laser powder bed fusion additive manufacturing device that includes a laser for generating a non-stationary laser beam and a build plane positioned at a predetermined location relative to the non-stationary laser beam. The portable testing apparatus includes a support having an upper surface adapted to receive and absorb laser light generated by the non-stationary laser beam; a plurality of pin-hole defining structures mounted at predetermined locations in the support such that each pin-hole defined is positioned to receive the laser light generated by the non-stationary laser beam, and such that each pin-hole is elevated at a predetermined height above the upper surface of the support and parallel thereto; a fiber optic cable disposed within each pin-hole defining structure, wherein each fiber optic cable has a proximal end at which the laser light is received through the pin-hole and a distal end to which the laser light is delivered; a photodetector located at the distal end of each fiber optic cable that converts the laser light delivered to the photodetector into electrical voltage output signals that are based on the intensity of the laser light received through each pin-hole; a data acquisition device in communication with the photodetector that receives, saves, and organizes the electrical signals as a function of time, or time and position, relative to the pin-holes through which the laser light was received; and a data analysis algorithm associated with the data acquisition device that calculates and determines laser beam quality based on data acquired from multiple passes of the non-stationary laser beam over the plurality of pin-holes.

In yet another aspect of this invention, a system for characterizing the beam of a laser used in a laser powder bed fusion additive manufacturing device is provided. This system includes a laser powder bed fusion additive manufacturing device that further includes at least one laser that generates a non-stationary laser beam having known or predetermined characteristics; and a build plane positioned at a predetermined location relative to the non-stationary laser beam, wherein the non-stationary laser beam translates (i.e., traverses) across the build plane in a controlled manner during additive manufacturing processes; a portable testing apparatus that is adapted to be placed within the laser powder bed fusion additive manufacturing device, wherein the portable testing apparatus includes a support having an upper surface, wherein the upper surface adapted to receive and absorb laser light generated by the non-stationary laser beam; a plurality of pin-hole defining structures mounted in the support at predetermined locations such that each pin-hole is positioned to receive the laser light generated by the non-stationary laser beam, and such that each pin-hole is elevated at a predetermined height above the upper surface of the support and parallel thereto; a fiber optic cable disposed within each pin-hole defining structure, wherein each fiber optic cable has a proximal end at which the laser light is received through the pin-hole and a distal end to which the laser light is delivered; and a photodetector located at the distal end of each fiber optic cable that converts the laser light delivered to the photodetector into electrical voltage output signals that are based on intensity of the laser light received through each pin-hole; a data acquisition device in communication with the photodetector that receives, saves, and organizes the electrical signals as a function of time, or time and position, relative to the pin-holes through which the laser light was received; and a data analysis algorithm associated with the data acquisition device that calculates and determines laser beam quality based on data acquired from multiple passes of the non-stationary laser beam over the plurality of pin-holes.

Additional features and aspects of the present invention will become apparent to those of ordinary skill in the art upon reading and understanding the following detailed description of the exemplary embodiments. As will be appreciated by the skilled artisan, further embodiments of the invention are possible without departing from the scope and spirit of the invention. Accordingly, the drawings and associated descriptions are to be regarded as illustrative and not restrictive in nature.

BRIEF DESCRIPTION OF THE DRAWINGS

The accompanying drawings, which are incorporated into and form a part of the specification, schematically illustrate one or more exemplary embodiments of the invention and, together with the general description given above and detailed description given below, serve to explain the principles of the invention, and wherein:

FIG. 6A is a front view of a pin-hole defining structure (pedestal), in accordance with an exemplary embodiment of the present invention, wherein a fiber optic cable has been inserted into the pin-hole defining structure (pedestal);

FIG. 6B is a cross-sectional view of the pin-hole defining structure (pedestal) and fiber optic cable assembly shown in FIG. 6A;

FIG. 7A is an illustration of the testing apparatus of the present invention being used to analyze the characteristics of a non-stationary laser beam being generated by a laser source present in a laser powder bed fusion system, wherein the laser beam is shown contacting the testing apparatus at a first position;

FIG. 7B is an illustration of the testing apparatus of the present invention being used to analyze the characteristics of a non-stationary laser beam being generated by a laser source present in a laser powder bed fusion system, wherein the laser beam is shown contacting the testing apparatus at a second position;

FIG. 7C is an illustration of the testing apparatus of the present invention being used to analyze the characteristics of a non-stationary laser beam being generated by a laser source present in a laser powder bed fusion system, wherein the laser beam is shown contacting the testing apparatus at a third position;

FIG. 7D is an illustration of the testing apparatus of the present invention being used to analyze the characteristics of a non-stationary laser beam being generated by a laser source present in a laser powder bed fusion system, wherein the laser beam is shown contacting the testing apparatus at a fourth position;

FIG. 7E is an illustration of the testing apparatus of the present invention being used to analyze the characteristics of a non-stationary laser beam being generated by a laser source present in a laser powder bed fusion system, wherein the laser beam is shown contacting the testing apparatus at a fifth position;

FIG. 7F is an illustration of the testing apparatus of the present invention being used to analyze the characteristics of a non-stationary laser beam being generated by a laser source present in a laser powder bed fusion system, wherein the laser beam is shown contacting the testing apparatus at a sixth position;

DETAILED DESCRIPTION OF THE INVENTION

Figure 1:
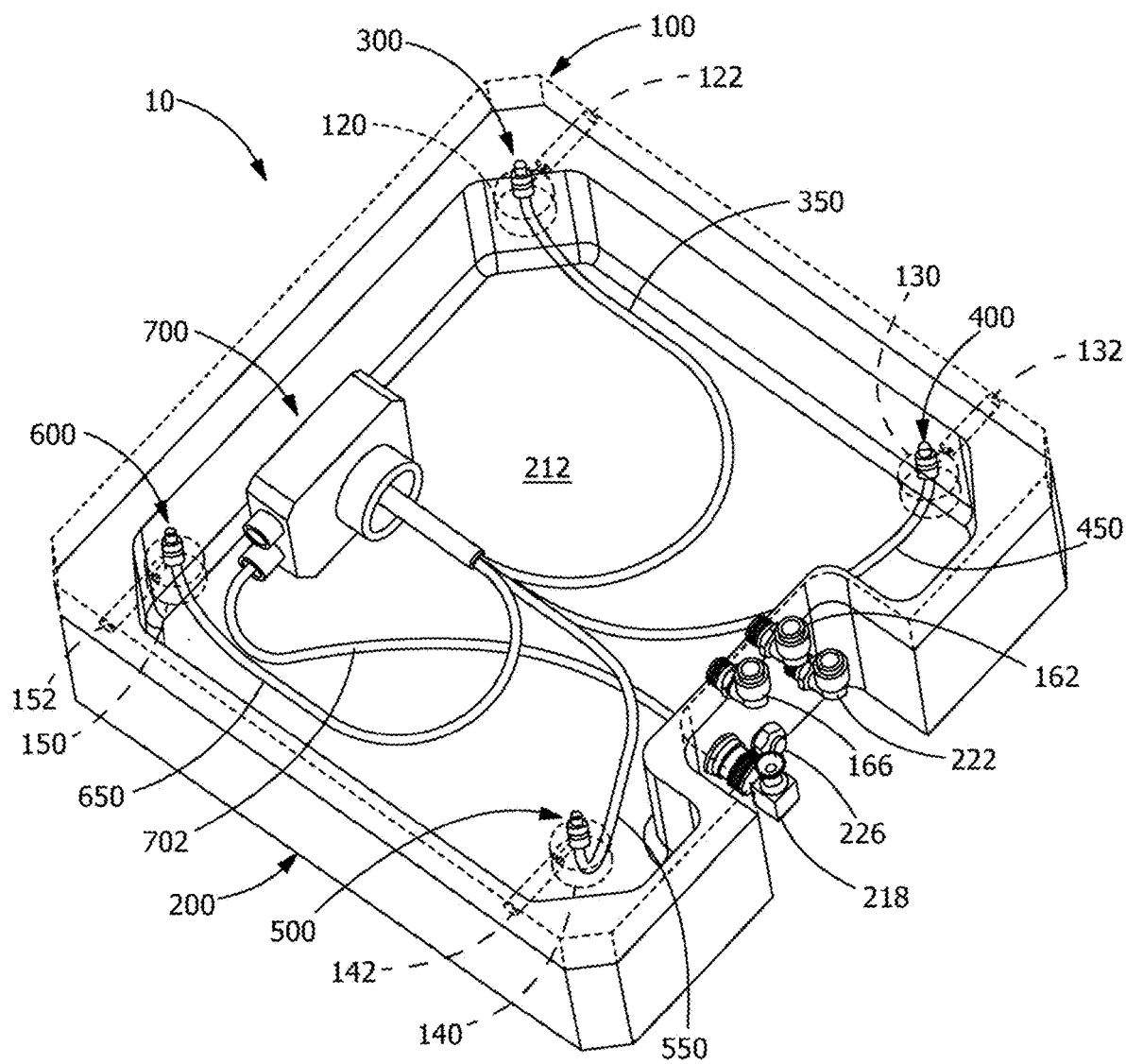
FIG. 1 is a perspective view of a testing apparatus for use with laser powder bed fusion systems, in accordance with an exemplary embodiment of the present invention, wherein the calibration plate/support component is shown in broken lines.
Figure 2:
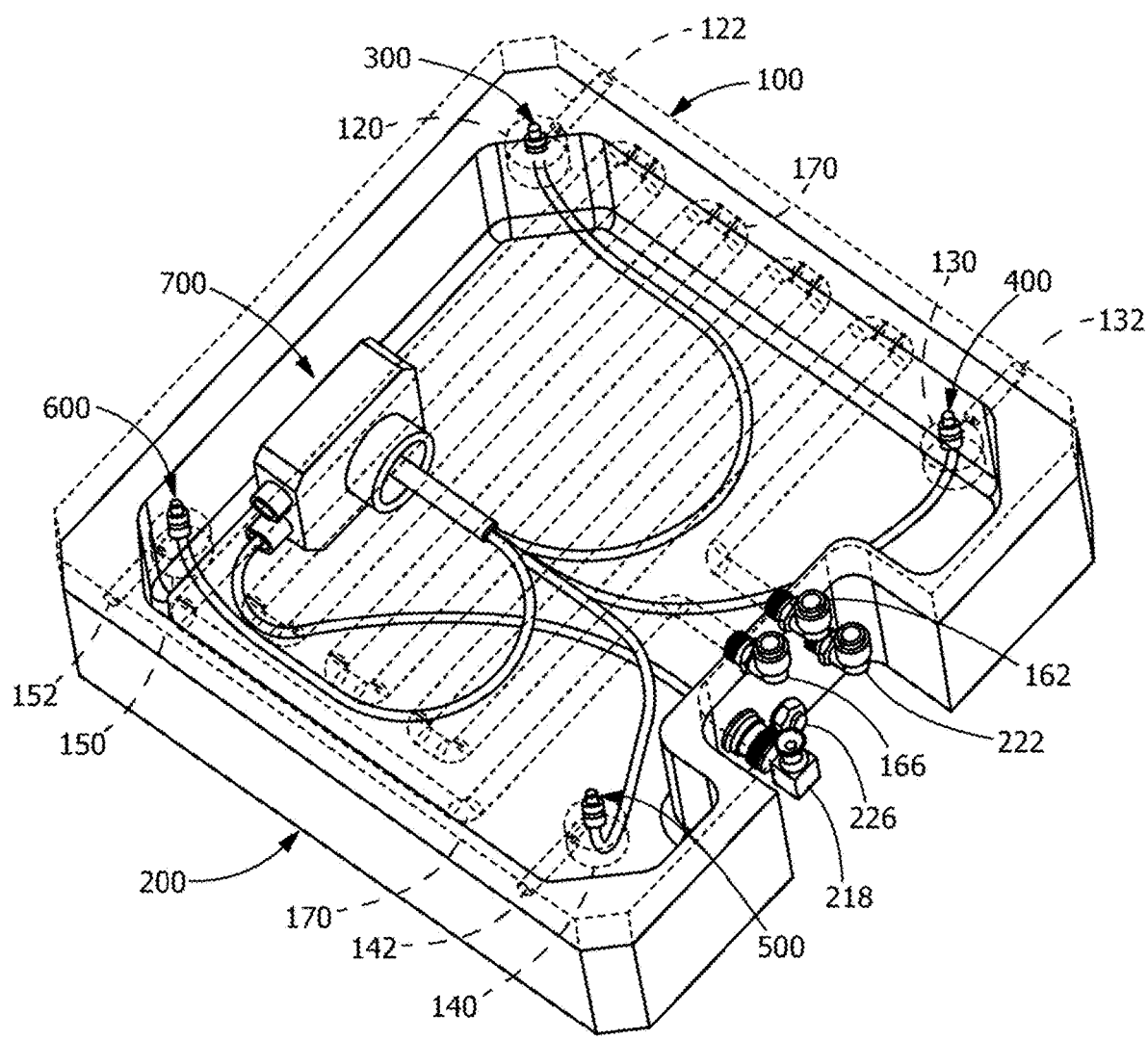
FIG. 2 is a perspective view of the testing apparatus of FIG. 1, wherein the calibration plate/support component and the cooling channels formed therein are shown in broken lines.
Figure 3:
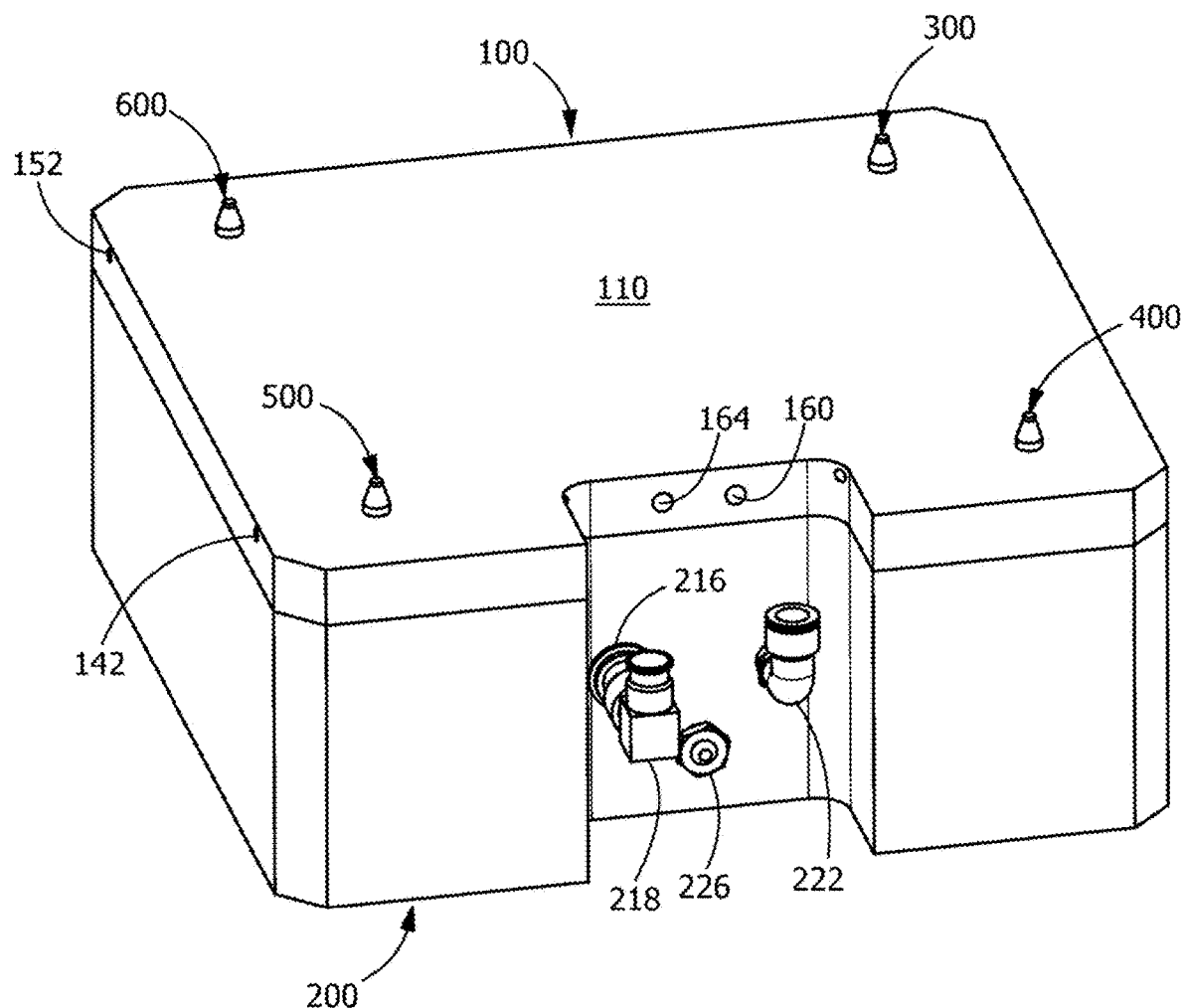
FIG. 3 is a perspective view of the testing apparatus of FIG. 1, wherein the calibration plate/support in which the pin-hole defining structures are mounted is shown in solid lines.
Figure 4:
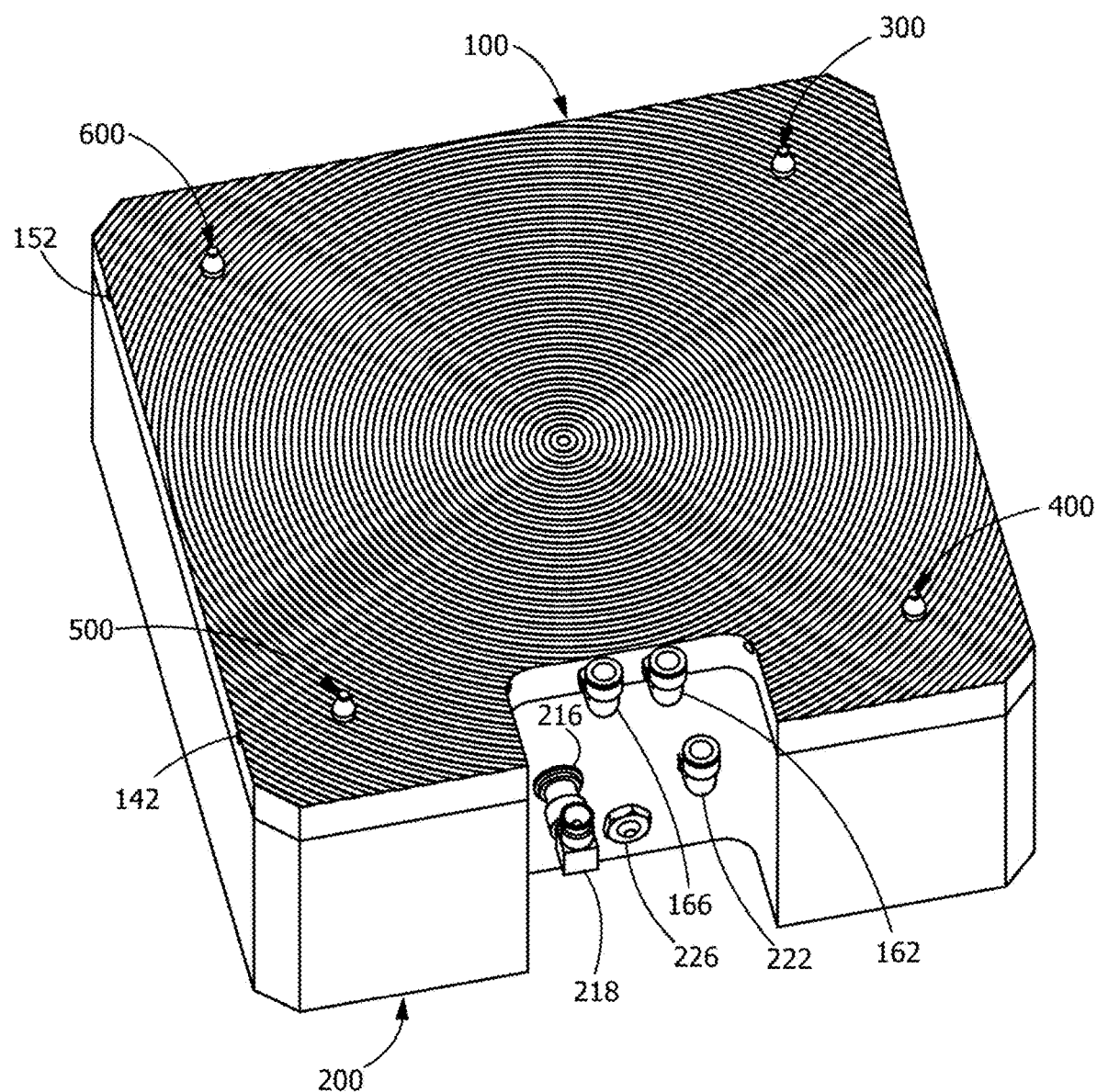
FIG. 4 is a perspective view of the testing apparatus of FIG. 1, wherein the upper surface of the calibration plate/support component includes a plurality of concentrically arranged ridges or raised portions for absorbing and distributing heat generated by a laser beam.
Figure 5C:
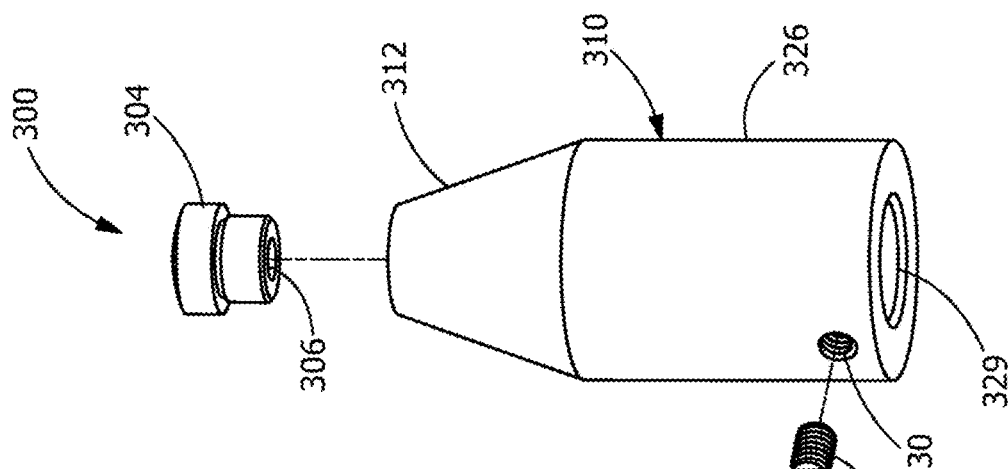
FIG. 5C is an exploded perspective view of the pin-hole defining structure (pedestal) of FIG. 5A.
Figure 5B:
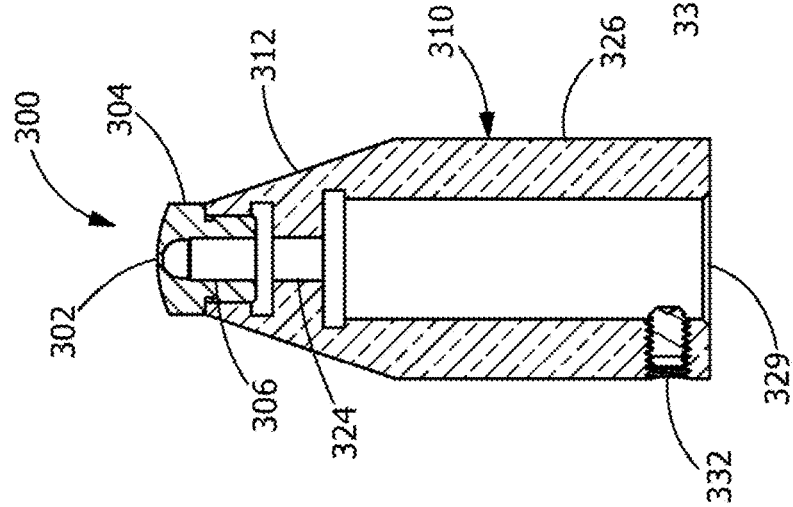
FIG. 5B is a cross-sectional view of the pin-hole defining structure (pedestal) of FIG. 5A.
Figure 5A:
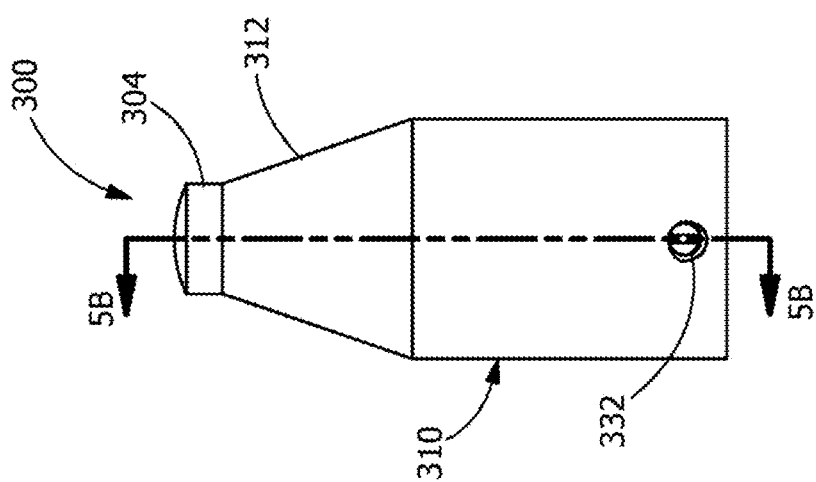
FIG. 5A is a front view of a pin-hole defining structure (pedestal), in accordance with an exemplary embodiment of the present invention, shown in an assembled state.

Exemplary embodiments of the present invention are now described with reference to the Figures. Reference numerals are used throughout the detailed description to refer to the various elements and structures. Although the following detailed description contains many specifics for the purposes of illustration, a person of ordinary skill in the art will appreciate that many variations and alterations to the following details are within the scope of the invention. Accordingly, the following embodiments of the invention are set forth without any loss of generality to, and without imposing limitations upon, the claimed invention.

As previously stated, the present invention provides systems, devices, and methods for profiling or characterizing the beam of a laser used in a laser powder bed fusion additive manufacturing device. This system includes a laser powder bed fusion additive manufacturing device that further includes at least one laser that generates a non-stationary laser beam having known or predetermined characteristics and a build plane positioned at a predetermined location relative to the non-stationary laser beam, wherein the non-stationary laser beam translates (i.e., traverses) across the build plane in a controlled manner during additive manufacturing processes; and a portable testing apparatus that is adapted to be placed within the laser powder bed fusion additive manufacturing device. FIGS. 1-4, 5A-C, 6A-6B, 7A-F, and 8A-C provide various illustrative views of a testing apparatus in accordance with an exemplary embodiment of the present invention.

As best shown in FIGS. 1-4, exemplary testing apparatus 10 includes support 100; base 200; pin-hole defining structures 300, 400, 500, and 600, which are mounted in support 100; and photodetector 700, which is located in base 200. Support 100, which is roughly square in shape, and which may be referred to as a calibration plate, includes an absorptive upper surface 110, which may further include a series of concentrically arranged ridges or other raised structures (see FIG. 4) that absorb and distribute heat generated by the laser beam for preventing damage to upper surface 110 and support 100. Support 100 further includes first mounting recess 120 (for receiving first pin-hole defining structure 300), first set screw aperture 122 (for receiving a set screw that secures first pin-hole defining structure 300 within first mounting recess 120), second mounting recess 130 (for receiving second pin-hole defining structure 400), second set screw aperture 132 (for receiving a set screw that secures second pin-hole defining structure 400 within second mounting recess 130), third mounting recess 140 (for receiving third pin-hole defining structure 500), third set screw aperture 142 (for receiving a set screw that secures third pin-hole defining structure 500 within third mounting recess 140, fourth mounting recess 150 (for receiving fourth pin-hole defining structure 600), and fourth set screw aperture 152 (for receiving a set screw that secures fourth pin-hole defining structure 600 within fourth mounting recess 150). Support 100 also includes first aperture 160 for receiving first coolant fitting 162, second aperture 164 for receiving second coolant fitting 166 and channels 170 for receiving and transporting liquid or gas coolant that transfers energy absorbed by support 100 away from testing apparatus 10.

Also, as best shown in FIGS. 1-4, base 200, the shape of which corresponds to the shape of support 100, cooperates with support 100 to form an enclosure. Base 200 includes outer wall 210 and inner cavity 212 in which photodetector 700 and the various fiber optic cables attached to the pin-hole defining structures are placed. Base 200 also includes aperture 214 for receiving Bayonet Neill-Concelman (BNC) bulkhead 216 to which BNC connector 218 is attached, second aperture 220 for receiving gas fitting 222, and third aperture 224 for receiving gas relief valve 226. In certain embodiments, a source of pressurized gas is connected to gas fitting 222 for delivering outwardly flowing gas to and through each pin-hole for preventing the contamination thereof by debris generated during the testing process or other debris.

With reference to FIGS. 1-4, 5A-C, and 6A-6B, the exemplary embodiment of testing apparatus 10 shown in the Figures includes four pin-hole defining structures, which are also referred to as "pedestals". FIGS. 5A-C and 6A-6B illustrate only first pin-hole defining structure 300; however, the remaining pin-hole defining structures (400, 500, and 600) are constructed in the same manner as first pin-hole defining structure 300. Accordingly, FIGS. 5A-C and 6A-6B are meant to be representative of all of the pin-hole defining structures depicted in the Figures.

As shown in FIGS. 5A-C and 6A-6B, first pin-hole defining structure or pedestal 300 includes first pin-hole 302, which is formed in tip 304 through which channel 306 passes. The diameter of pin-hole 302 is typically one third to one-thirtieth the diameter of the laser beam being characterized by testing apparatus 10 (e.g., pinhole diameter: 5-50 μm). Tip 304 typically includes a highly reflective material such as gold, copper, or other reflective metal for minimizing damage to the pin-hole and pin-hole defining structure caused by absorption of energy from the laser beam. Tip 304 is mounted within body 310 which includes tapered portion 312 and cylindrical portion 326 through which channel 328 passes. First set screw aperture 330 is adapted to receive first set screw 332 which secures first fiber optic cable 350 in body 310. First optical fiber 352 is inserted into channel 306 and brought into close proximity with first pin-hole 302. First pin-hole defining structure or pedestal 300 is mounted within support 100 such that the pin-hole is elevated above upper surface 110 at a height (e.g. 20 to 40 mm) that minimizes any damage to the pin-hole and pedestal that may be caused by the energy of the non-stationary laser beam.

FIGS. 7A-7F are illustrations of testing apparatus 10 being used to analyze the characteristics of a non-stationary laser beam generated by a laser source present in a laser powder bed fusion system being used for additive manufacturing. In these Figures, laser source 800 generates laser beam 802, which contacts upper surface 110 of testing apparatus 10 at multiple positions or locations, including locations that include the previous discussed pin-holes. During the normal operation of testing apparatus 10, laser beam 802 is continually manipulated at typical operating power for bringing all the laser beam delivery elements of the laser powder bed fusion machine or system up to normal operating temperature and functionality such that any misalignment of laser beam 802 or loss of laser focus quality may be detected.

Figure 8A:
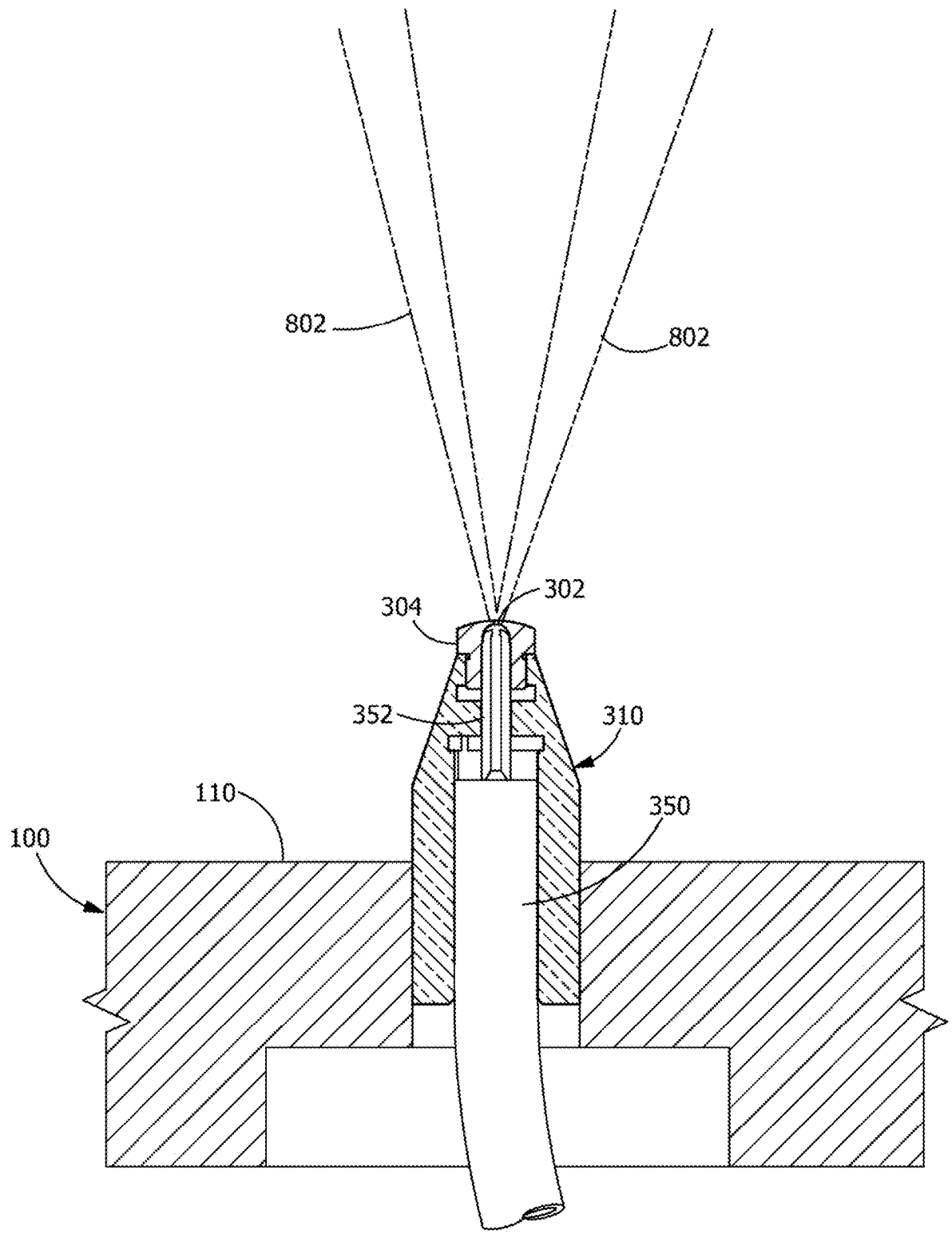
FIG. 8A is a cross-sectional view of one of the pin-hole defining structures of the present invention shown mounted in the calibration plate/support and receiving laser light from a laser beam being analyzed by the testing apparatus.
Figure 8B:
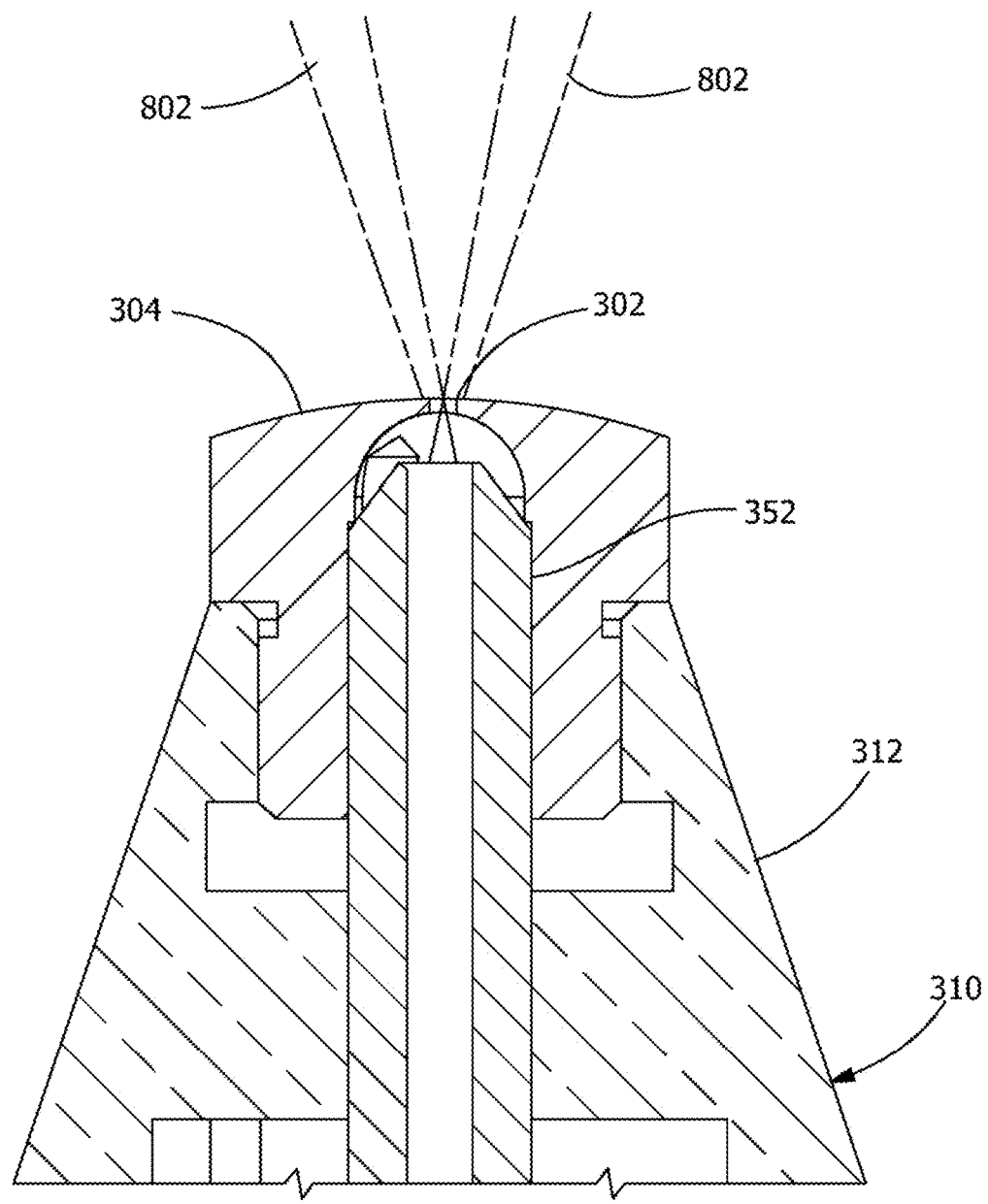
FIG. 8B is a detail of the upper portion of FIG. 8A showing a portion of the laser light passing through a pin-hole and the remaining laser light being reflected by the pin-hole defining structure.
Figure 8C:
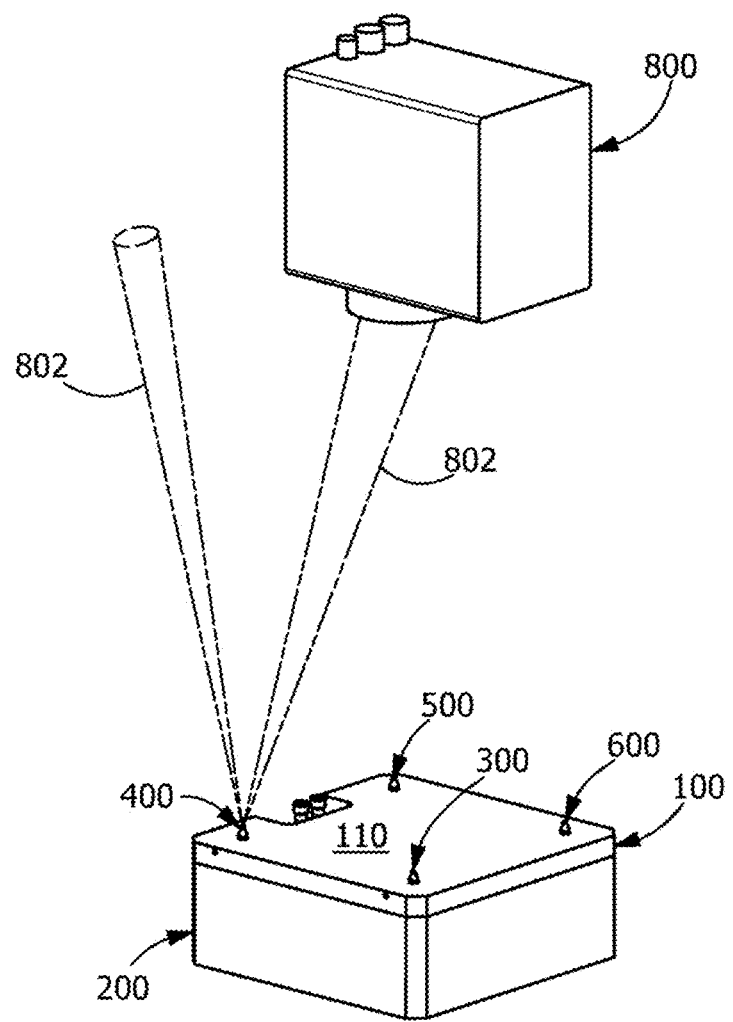
FIG. 8C is an illustration of the testing apparatus of the present invention being used to analyze the characteristics of a non-stationary laser beam being generated by a laser source present in a laser powder bed fusion system, wherein the laser beam is shown reflecting from one of the pin-hole defining structures.

FIG. 8A provides a cross-sectional view of pin-hole defining structure 300 shown mounted in support 100 and receiving laser light from laser beam 802 during normal operation of a laser powder bed fusion system being analyzed. FIG. 8B is a detail of the upper portion of FIG. 8A showing the laser light being reflected by pin-hole defining structure 300; and FIG. 8C provides an illustration of testing apparatus 10 being used to analyze the characteristics of non-stationary laser beam 802 being generated by laser source 800, wherein laser beam 802 is shown reflecting from pin-hole defining structure 400. In FIGS. 8A-8B, light from laser beam 802 is shown passing through pin-hole 302 and entering optical fiber 352 through which the signal is transmitted to photodetector 700 (see FIG. 1). The laser light than passes through pin-hole 302 is only a small amount of the laser light generated by laser beam 802. For example, for a laser beam having a total diameter of about 0.1 mm, the diameter of the portion of the beam that passes though pin-hole 302 would be about 0.025 mm. Laser light collected from each pin-hole may be transmitted to one or more light measuring devices through fiber optic coupling. Testing apparatus 10 includes a data acquisition device in communication with photodetector 700, wherein the data acquisition device receives, saves, organizes, and analyzes electrical signals as a function of time, or time and position, relative to the pin-holes through which the laser light was received. A data analysis algorithm associated with the data acquisition device calculates and determines laser beam quality based on data acquired from multiple passes of the non-stationary laser beam over the plurality of pin-holes. The data acquisition device may also include hardware and/or software (e.g., blue tooth or the like) that enables the transmission of data to a receiver located outside of an additive manufacturing device.

The embodiment of testing apparatus 10 shown in the Figures includes four pin-hole defining structures and four corresponding pin-holes located at each corner of the generally square-shaped testing apparatus. In other embodiments, the general size of testing apparatus 10 and the number of pin-hole defining structures and corresponding pin-holes may be increased up to, for example, thirteen. Testing apparatus 10 is scalable and may be modified based on the size and type of laser powder bed fusion system or device that is being analyzed. Testing apparatus 10 may be adapted for use with larger additive manufacturing systems that include multiple scanners, the scanning zones of which must be properly aligned to overlap in a precise manner.

The present invention may be modified or adapted for use with many different types of laser-based additive manufacturing devices and systems. In one embodiment, the outer body of testing apparatus 10 provides precision reference planes (X, Y, Z) for defining the location of the testing apparatus and its pin-hole locations when the system is placed within the laser powder bed fusion (L-PBF) build zone. In another embodiment, the location of each pin-hole is measured with a precision, traceable measurement device for determining the exact locations thereof on the plane that they define. These measurements are unique in their precision for each individual testing apparatus and can be used to assure the precision of the laser beam measurements made with the testing apparatus. In another embodiment, received electrical signals are reconstructed programmatically to build a two-dimensional image of laser intensity and analyzed using machine vision principles to measure laser spot size and shape characteristics. The known distances between pin-holes can be used to determine the velocity of the non-stationary laser beam as it translates from pin-hole to pin-hole at different locations and directions on the L-PBF build plane.

In another embodiment, a plurality of laser tracks is manipulated over each pin-hole at a step width less than the expected laser beam diameter and the resultant electrical signals are acquired using a data acquisition device at an acquisition rate greater than 50 kHz. In another embodiment, acquired electrical signals are streamed to onboard memory within the chamber of the laser powder bed fusion system and transferred wirelessly to the data acquisition device. Acquired electrical signals may be reconstructed programmatically to build a three-dimensional representation of laser intensity and analyzed using machine vision principles to measure three laser beam characteristics, specifically laser beam quality (mm*milliradians), focal spot diameter (um), and Rayleigh length (um). In another embodiment, a non-stationary laser beam (at typical operational power) can be delivered along a predefined track on support 100 for a given amount of continuous time prior to manipulation of the laser beam over the pin-hole(s), for measuring any resultant changes in laser focal spot characteristics that may be induced during actual operation of the L-PBF system. In another embodiment, testing apparatus 10 is manipulated in vertical step increments using the L-PBF build plane axis to acquire data about the non-stationary laser beam, relative to the nominal build plane location. In still another embodiment, a spatial map of laser power compensation factors is calculated based on measured laser beam characteristics and implemented within the laser position controller for position-based laser power control.

While the present invention has been illustrated by the description of exemplary embodiments thereof, and while the embodiments have been described in certain detail, there is no intention to restrict or in any way limit the scope of the appended claims to such detail. Additional advantages and modifications will readily appear to those skilled in the art. Therefore, the invention in its broader aspects is not limited to any of the specific details, representative devices and methods, and/or illustrative examples shown and described. Accordingly, departures may be made from such details without departing from the spirit or scope of the general inventive concept.

What is claimed:

1. A portable testing apparatus for use with a laser powder bed fusion additive manufacturing device, wherein the additive manufacturing device includes a laser for generating a non-stationary laser beam and a build plane positioned at a predetermined location relative to the non-stationary laser beam, and wherein the portable testing apparatus includes:
(a) a support having an upper surface adapted to receive and absorb laser light generated by the non-stationary laser beam;
(b) a plurality of pin-hole defining structures each positioned to receive the laser light generated by the non-stationary laser beam, and such that each pin-hole is elevated at a predetermined height above the upper surface of the support and parallel thereto; (c) a fiber optic cable disposed within each pin-hole defining structure, wherein each fiber optic cable has a proximal end at which the laser light is received through the pinhole and a distal end to which the laser light is delivered; and (d) a photodetector located at the distal end of each fiber optic cable, wherein the photodetector converts the laser light delivered to the photodetector into electrical voltage output signals based on intensity of the laser light received through each pin-hole.

2. The portable testing apparatus of claim 1, further comprising a data acquisition device in communication with the photodetector, wherein the data acquisition device receives, saves, organizes, and analyzes the electrical signals as a function of time, or time and position, relative to the pin-holes through which the laser light was received.

3. The portable testing apparatus of claim 2, further comprising a data analysis algorithm associated with the data acquisition device that calculates and determines laser beam quality based on data acquired from multiple passes of the non-stationary laser beam over the plurality of pin-holes.

4. The portable testing apparatus of claim 1, further comprising a plurality of cooling channels mounted below the support and a source of outwardly flowing gas in communication with each pin-hole for preventing the contamination thereof.

5. The portable testing apparatus of claim 1, wherein the upper surface of the support further includes a plurality of concentric ridges, and wherein these ridges absorb and distribute heat generated by the laser beam for preventing damage to the upper surface and support.

6. The portable testing apparatus of claim 1, wherein each pin-hole has a diameter and wherein the diameter of each pin-hole is one third to one-thirtieth the diameter of the laser beam being characterized.

7. The portable testing apparatus of claim 1, wherein each pin-hole defining structure includes at least one highly reflective material for minimizing damage to the pin-hole and pin-hole defining structure caused by absorption of energy from the laser, and wherein the at least one highly reflective material includes gold, copper, or other reflective metal.

8. A portable testing apparatus for use with a laser powder bed fusion additive manufacturing device, wherein the additive manufacturing device includes a laser for generating a non-stationary laser beam and a build plane positioned at a predetermined location relative to the non-stationary laser beam, and wherein the portable testing apparatus includes:
(a) a support having an upper surface, wherein the upper surface is adapted to receive and absorb laser light generated by the non-stationary laser beam;
(b) a plurality of pin-hole defining structures mounted at predetermined locations in the support such that each pin-hole is positioned to receive the laser light generated by the non-stationary laser beam, and such that each pin-hole is elevated at a predetermined height above the upper surface of the support and parallel thereto;
(c) a fiber optic cable disposed within each pin-hole defining structure, wherein each fiber optic cable has a proximal end at which the laser light is received through the pin-hole and a distal end to which the laser light is delivered;
(d) a photodetector located at the distal end of each fiber optic cable, wherein the photodetector converts the laser light delivered to the photodetector into electrical voltage output signals that are based on intensity of the laser light received through each pin-hole;
(e) a data acquisition device in communication with the photodetector, wherein the data acquisition device receives, saves, organizes, and analyzes the electrical signals as a function of time, or time and position, relative to the pin-holes through which the laser light was received; and
(f) a data analysis algorithm associated with the data acquisition device that calculates and determines laser beam quality based on data acquired from multiple passes of the non-stationary laser beam over the plurality of pin-holes.

9. The portable testing apparatus of claim 8, further comprising a plurality of cooling channels mounted below the support and a source of outwardly flowing gas in communication with each pin-hole for preventing the contamination thereof.

10. The portable testing apparatus of claim 8, further comprising a plurality of cooling channels mounted below the support.

11. The portable testing apparatus of claim 8, further comprising a source of outwardly flowing gas in communication with each pin-hole for preventing the contamination thereof.

12. The portable testing apparatus of claim 8, wherein the upper surface of the support further includes a plurality of concentric ridges, and wherein these ridges absorb and distribute heat generated by the laser beam for preventing damage to the upper surface and support.

13. The portable testing apparatus of claim 8, wherein each pin-hole has a diameter and wherein the diameter of each pin-hole is one third to one-thirtieth the diameter of the laser beam being characterized.

14. The portable testing apparatus of claim 8, wherein each pin-hole defining structure includes at least one highly reflective material for minimizing damage to the pin-hole and pin-hole defining structure caused by absorption of energy from the laser, and wherein the at least one highly reflective material includes gold, copper, or other reflective metal.

15. A system for characterizing the beam of a laser used in a laser powder bed fusion additive manufacturing device, comprising:
(a) a laser powder bed fusion additive manufacturing device, wherein the laser powder bed fusion additive manufacturing device includes:
(i) at least one laser, wherein the laser generates a non-stationary laser beam having known or predetermined characteristics; and
(ii) a build plane positioned at a predetermined location relative to the non-stationary laser beam,
(iii) wherein the non-stationary laser beam translates across the build plane in a controlled manner during additive manufacturing processes;

(b) a portable testing apparatus, wherein the portable testing apparatus is adapted to be placed within the laser powder bed fusion additive manufacturing device, and wherein the portable testing apparatus includes:
  (i) a support having an upper surface adapted to receive and absorb laser light generated by the non-stationary laser beam;
  (ii) a plurality of pin-hole defining structures each positioned to receive the laser light generated by the non-stationary laser beam, and such that each pin-hole is elevated at a predetermined height above the upper surface of the support and parallel thereto;
  (iii) a fiber optic cable disposed within each pin-hole defining structure, wherein each fiber optic cable has a proximal end at which the laser light is received through the pin-hole and a distal end to which the laser light is delivered; and
  (iv) a photodetector located at the distal end of each fiber optic cable, wherein the photodetector converts the laser light delivered to the photodetector into electrical voltage output signals that are based on intensity of the laser light received through each pin-hole;
(c) a data acquisition device in communication with the photodetector, wherein the data acquisition device receives, saves, organizes, and analyzes the electrical signals as a function of time, or time and position, relative to the pin-holes through which the laser light was received; and
(d) a data analysis algorithm associated with the data acquisition device that calculates and determines laser beam quality based on data acquired from multiple passes of the non-stationary laser beam over the plurality of pin-holes.

16. The system of claim 15, further comprising a plurality of cooling channels mounted below the support and a source of outwardly flowing gas in communication with each pin-hole for preventing the contamination thereof.

17. The system of claim 15, wherein the known or predetermined characteristics of the non-stationary laser beam include size, shape, and power distribution of the laser beam.

18. The system of claim 15, wherein the upper surface of the support further includes a plurality of concentric ridges, and wherein these ridges absorb and distribute heat generated by the laser beam for preventing damage to the upper surface and support.

19. The system of claim 15, wherein each pin-hole has a diameter and wherein the diameter of each pin-hole is one third to one-thirtieth the diameter of the laser beam being characterized.

20. The system of claim 15, wherein each pin-hole defining structure includes at least one highly reflective material for minimizing damage to the pin-hole and pin-hole defining structure caused by absorption of energy from the laser, and wherein the at least one highly reflective material includes gold, copper, or other reflective metal.

* * * * *